United States Patent
Mangat et al.

[11] Patent Number: 5,899,728
[45] Date of Patent: May 4, 1999

[54] METHOD OF FORMING A LITHOGRAPHIC MASK

[75] Inventors: Pawitter J. S. Mangat, Chandler; William J. Dauksher, Mesa, both of Ariz.

[73] Assignee: Motorola, Inc., Schaumburg, Ill.

[21] Appl. No.: 08/996,164

[22] Filed: Dec. 22, 1997

[51] Int. Cl.[6] .............................. H01L 21/30; H01L 21/46
[52] U.S. Cl. .............................. 438/459; 438/949; 430/5; 430/313; 430/314; 430/323
[58] Field of Search ....................... 438/455, 459, 438/424, 425, 439, 444, 949; 430/313, 314, 5, 323

[56] References Cited

U.S. PATENT DOCUMENTS 5,426,016   6/1995   Fujioka et al. .
5,521,033   5/1996   Okamoto .

OTHER PUBLICATIONS

Berger, et al., "Projection Electron–Beam Lithography: A New Approach", J. Vac. Sci. Technol. B, vol. 9 (60), pp. 2996–2999 (1991).

Liddle, et al., "Mask Fabrication for Projection Electron–Beam Lithography Incorporating the SCALPEL Technique", J. Vac. Sci. Technol. B 9 (6), pp. 3000–3004 (1991).

*Primary Examiner*—Richard A. Booth
*Assistant Examiner*—Josetta I. Jones

[57] ABSTRACT

A method of forming a lithographic mask that comprises the steps of obtaining a first substrate having a first base and a first layer over the first base. The first layer is patterned, as is at least a portion of the entire thickness of the first base to form a first pattern. A second substrate having a second base is obtained and a second layer is formed over the second base. A third layer is formed over the second layer. The third layer is patterned to form an attenuating pattern corresponding to a semiconductor device feature pattern and the first and second substrates are bonded after patterning the first layer. The second base is etched to remove the entire thickness of the second base corresponding to the first pattern. The steps need not be sequential in the above method.

35 Claims, 8 Drawing Sheets

METHOD OF FORMING A LITHOGRAPHIC MASK

FIELD OF THE INVENTION

The present invention relates generally to semiconductor devices, and more particularly to a method of forming a lithographic mask for patterning a semiconductor device.

BACKGROUND OF THE INVENTION

Lithography processes are used to transfer patterns from a mask to a semiconductor device. As feature sizes on semiconductor devices decrease into the submicron range, there is a need for new lithography processes to pattern high-density semiconductor devices. Projection electron-beam lithography is a well-known reduction technique for patterning semiconductor devices. In general, a projection electron-beam lithography system scans a beam across a mask to create an image on the semiconductor device. Electron optics can be inserted to provide a means of image reduction. One particular type of projection electron beam lithography is known as Scattering with Angular Limitation in Projection Electron-Beam Lithography developed by Lucent Technologies, Incorporated of Murray Hill, New Jersey. The basic principles of this technique are illustrated in prior art FIG. 1.

From prior art FIG. 1, a mask 10 having a patterned scattering layer 14 is provided on membrane 12, through which an electron beam is projected as represented by the flux arrows 13. The patterned scattering layer 14 produces more electron scattering than the membrane 12 as a result of the difference in atomic numbers between the composition of the patterned scattering layer 14 and the membrane 12, i.e., the patterned scattering layer 14 has a higher atomic number than that of the membrane 12. The scattering effect 16 of the electron beam through portions of the mask 10 is illustrated in FIG. 1. As shown, those portions of the electron beam that pass through the patterned scattering layer 14 tend to be scattered through larger angles, as depicted by the scattering effect 16, when compared with those less scattered portions 17 that pass between unpatterned portions of the scattering layer 14.

As shown, the electron beam that passes through the mask 10 is focused through an electron focusing system represented by lens 20. The electron beam then passes through back focal plane filter 30 having an aperture 18 that is provided to permit passage of those portions of the electron beam that were not scattered by the patterned scattering layer 14 of the mask 10 through some finite angle. The electron beam is then projected onto a semiconductor wafer 40 having a plurality of die 42 and a resist layer 44 spun on the semiconductor wafer 40 by conventional techniques. The electron beam forms a high contrast image including areas of low intensity formed by those scattered portions 16 of the electron beam that pass through patterned portions of the mask 10, and areas of relatively high intensity formed by those less scattered portions 17 of the electron beam that pass through the unpatterned areas of the mask 10. In this way, a high-resolution image may be projected onto the resist layer 44, which is then developed to form an exposed resist layer. The patterned resist layer 44 may be used as an etch mask for the underlying material. It is noted that the electron optics of the system may be adjusted so as to provide a reduction in image size, typically 4X or one-fourth the image size on the mask 10.

A typical mask fabrication methodology using Scattering With Angular Limitation In Projection Electron-Beam Lithography is shown in prior art FIG. 2. FIG. 2 depicts cross-sectional views of processing steps applied to the same semiconductor wafer to form a mask. The methodology begins at step 50 by providing a silicon wafer 51, the silicon wafer having a silicon wafer top surface 53 and a silicon wafer bottom surface 52. At step 60, the silicon wafer 51 is processed to form a silicon nitride film 61 that is deposited around the silicon wafer 51, on both the top 53 and bottom 52 surfaces, using conventional low pressure chemical vapor deposition (LPCVD). The silicon nitride film 61 is typically called a membrane film, such as membrane 12 of FIG. 1, on which a scattering layer, such as the patterned scattering layer 14 of FIG. 1, will be formed. At step 70, two other films are deposited, using conventional sputtering techniques, to form an etch stop layer 72, such as a chromium layer, and a scatterer film 71, such as a tungsten layer, above the etch stop layer 72. The etch stop layer 72 is used to prevent an etch species, used during the patterning of the scatterer film 71, to "attack" the silicon nitride film 61. In step 80, a sacrificial layer 81, typically a chromium layer, is deposited on the scatterer film 71 to protect the layers between the sacrificial layer 81 and the silicon wafer top surface 53 from defects and film scratches when the silicon wafer bottom surface 52 is processed.

At step 90, the silicon wafer 51 has been "flipped" so that the silicon wafer bottom surface 52 may be processed and a resist layer 91 has been spun onto the silicon nitride film 61 on the silicon wafer bottom surface 52. Then at step 100, the resist layer 91 has been patterned, such as with an aligner, stepper or electron beam tool, and then developed. At step 110, the silicon nitride layer 61 has been etched down to the silicon wafer bottom surface 52. At step 120, the resist layer 91 has been removed and the silicon wafer 51 has been etched down to the silicon nitride film 61 on the silicon wafer top surface 53. it should be noted that since the silicon wafer 51 has been etched through in step 120, the silicon nitride film 61 on the silicon wafer top surface 53 now becomes a plurality of free standing membranes, and, as such, the remaining process steps occur on membranes only. Next, at step 125, the wafer, which contains a plurality of membranes, has been "flipped" to process the layers on the silicon wafer top surface 53 and the sacrificial layer 81 has been removed leaving the scatterer film 71 forming a "blank mask". At step 140, a second resist layer 141 has been spun on the scatterer film 71 in order to form a pattern on the scatterer film 71. At step 150, the resist is patterned and developed. Then, at step 160, the second resist layer 141 is used as a mask to define the scatterer film 71 and the resist 141 is removed. Thus, at step 160, the mask is completed. Prior art FIG. 2A is an exploded view of the mask at step 160 depicting the patterned scatterer film 71 positioned between "struts" (i.e. patterned silicon nitride film 61 on silicon wafer bottom surface 52 and silicon wafer 51).

Certain problems exist with the mask fabrication methodology shown in prior art FIG. 2. First, this methodology has a long turn around time (TAT). This is due to several factors. One factor is that processing must sequentially be carried out first on one side of the wafer and then on the other side. It is not possible to simultaneously do both. Another factor that produces a long TAT is that additional steps are required using this methodology due to the deposition and removal of protective layers such as in steps 80 and 125 of FIG. 2 that apply and remove the sacrificial layer 81. The additional steps contribute to a long TAT, in addition to higher defects due to additional handling of the silicon wafer and thereby causing a lower yield.

A further problem with the methodology of FIG. 2 is that the mask being formed in FIG. 2 is easily damaged which may reduce the wafer yield. This is because, at steps 140, 150 and 160, all processes must be carried out on very thin (approximately 1,000 Å) membranes, which is very difficult to do and which could easily lead to a broken membrane. Additionally, since the silicon wafer is being processed on both sides, that is the silicon wafer top surface 53 and the back surface 52, care must be taken in handling the wafer so that neither surface is damaged. This results in the use of manual tweezers or an equivalent peripheral device that does not adhere to either side of the silicon wafer that is being processed. As such, the handling of a device undergoing the methodology of FIG. 2 is difficult which may produce a long TAT or low yield. Also, all the problems listed above become even more difficult as the wafer sizes increase and therefore additional membranes may be damaged. A need therefore exists for a mask fabrication methodology that avoids the problems listed above.

BRIEF DESCRIPTION OF THE DRAWINGS

A better understanding of the present invention can be obtained when the following detailed description of a preferred embodiment is considered in conjunction with the following drawings, in which.

Figure 1:
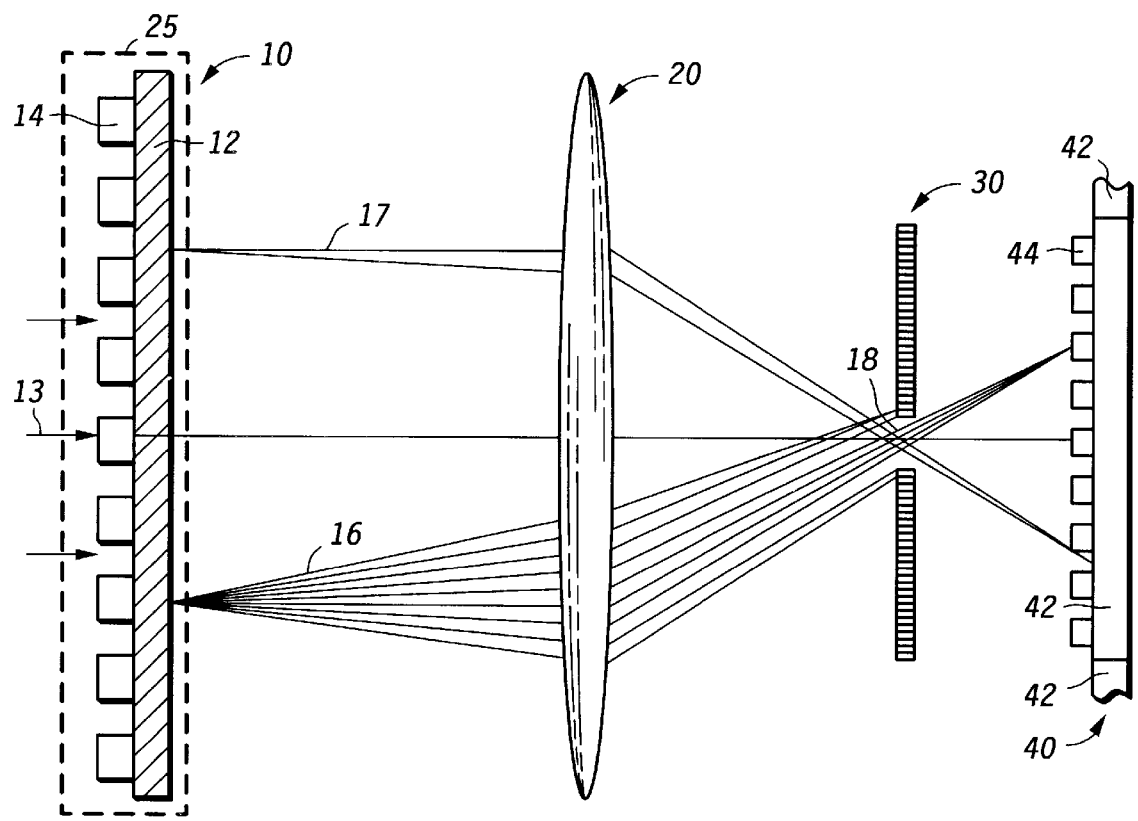
FIG. 1 is a prior art schematic view of a lithography technique known as Scattering With Angular Limitation In Projection Electron-Beam Lithography.

It will be appreciated that for simplicity and clarity of illustration, elements illustrated in the drawings have not necessarily been drawn to scale. For example, the dimensions of some of the elements are exaggerated relative to other elements for purposes of clarity. Further, where considered appropriate, reference numerals have been repeated among the drawings to indicate corresponding or analogous elements.

DETAILED DESSCRIPTION OF A PREFERRED EMBODIMENT

In the following detailed description, various embodiments of the method of forming a lithographic mask will be detailed. It is understood, however, that the present invention is directed to a method of forming a lithographic mask that comprises the steps of obtaining a first substrate having a first base and a first layer over the first base. The first layer is patterned, as is at least a portion of the entire thickness of the first base to form a first pattern. A second substrate having a second base is obtained and a second layer is formed over the second base. A third layer is formed over the second layer. The third layer is patterned to form an attenuating pattern corresponding to a semiconductor device feature pattern and the first and second substrates are bonded after patterning the first layer. The second base is etched to remove the entire thickness of the second base corresponding to the first pattern. It is important to note that all of the above mentioned steps need not be sequential, and indeed, several embodiments of the present invention as described in detail below show that there are advantages to changing the order of the particular steps in the above method. The method of the present invention will now be described in detail with reference to FIGS. 3–8.

Figure 3:
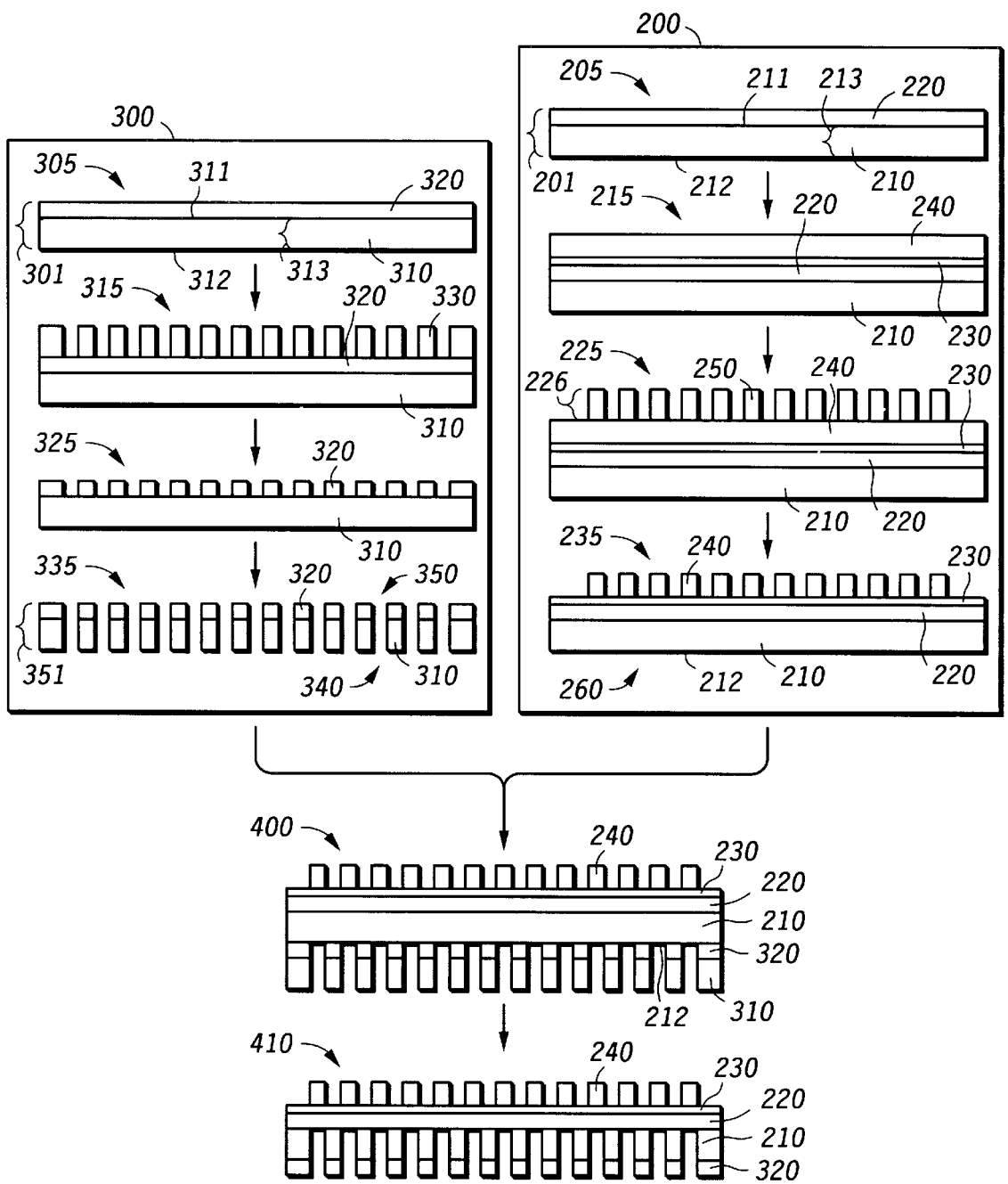
FIG. 3 depicts cross-sectional views of the steps used in an embodiment of the method of forming a lithographic mask of the present invention.

In FIG. 3, cross-sectional views are shown of the steps used in an embodiment of the method of forming a lithographic mask of the present invention. FIG. 3 depicts the steps of processing two substrates, for example two semiconductor wafers, where parallel processing to each substrate is encapsulated, for purposes of explanation, in a first substrate processing box 300 and second substrate processing box 200. It should be noted that the processing steps shown in boxes 300 and 200 are performed on a semiconductor device to form a mask, and as such, are mask processing steps. In the first substrate processing box 300, a first substrate 301 is obtained that has a first base 310 and a first layer 320 over the first base first side 311 of first base 310. The first base 310 may be a silicon wafer, however, other wafer materials may be used such as germanium, silicon carbide, or gallium arsenide. The first base 310 has a first base first side 311 and a first base second side 312, with a first base semiconductor material 313, such as those listed above for the first base 310, between the two sides. The first base first side 311 and the first base second side 312 lie substantially along a first crystal plane (not shown), that is the orientation of the semiconductor crystal planes forming the first base first and second sides lie substantially on the same plane. Considering the case of a silicon substrate, the first crystal plane is selected from a group consisting of a (100) crystal plane or a (110) crystal plane. The first layer 320 is deposited over the first base 310 of the first substrate 301. Throughout the first and second substrate processing boxes 300 and 200, different layers and films are deposited using conventional film deposition techniques. The first layer 320 is silicon nitride, but may also be other materials such as doped semiconductor, silicon carbide or diamond.

At mask processing steps 315 through 335, the first layer 320 is patterned as is the entire thickness of the first base 310 to form a first pattern 351 at step 335. The patterning is achieved using conventional etching techniques, for example dry or wet etching. It is understood that while this embodiment patterns the entire thickness of the first base 310, one skilled in the art of the present invention would appreciate that at least a portion of the entire thickness of the first base 310 may also be patterned to form a first pattern, yet fall within the scope of the present invention as set forth in the claims below. At step 315, a first substrate resist layer 330, typically with a thickness in the range of 2,000 to 12,000 angstroms, is spun on the first layer 320 to coat the first layer 320 and then patterned to form the structure at step 315. At step 325, the first substrate resist layer 330 is used to etch the first layer 320 and the first substrate resist layer 330 is removed using conventional techniques. At step 335, the first base 310 is wet etched down to the first base second side 312 of the first base 310. The etchant used may be potassium hydroxide, however other etchants such as hydrofluoric, nitric and acetic acids or ethylene diamene pyrocatechol may also be used. Simultaneous to the processing occurring in the first substrate processing box 300 is the processing of a second substrate as depicted in the second substrate processing box 200 of FIG. 3. This simultaneous processing enhances the TAT of the processing of these substrates since both of the substrates may be processed at once, rather than processing one side of a substrate and then processing the opposite side of the same substrate thereafter.

In the second substrate processing box 200, a second substrate 201, at step 205, has a second base 210, typically a silicon wafer, which like the first base 310, may be other wafer materials such as germanium, silicon carbide, or gallium arsenide. The second base 210 also has a second base first side 211 and a second base second side 212, with a second base semiconductor material 213, such as those listed above for the second base 210, between the two sides. The second base first side 211 and the second base second side 212 lie substantially along a second crystal plane (not shown), that is the orientation of the semiconductor crystal planes forming the second base first and second sides lie substantially on the same plane. The second crystal plane is selected from a group consisting of a (100) crystal plane or a (110) crystal plane. Also at step 205, a second layer 220 is deposited over the second base 210, where the second layer 220 is a membrane material used for the mask, for example silicon nitride. Other membrane materials for the second layer 220 include silicon carbide, doped semiconductor and diamond. The second layer 220 is used to provide a medium for a scatterer layer, i.e. a third layer 240, formed at step 215. The second layer 220 typically has a thickness around 1000 angstroms, generally no more than about 1500 angstroms, and is deposited using a technique such as rapid thermal chemical vapor deposition (RTCVD). The third layer 240, that is used as a scatterer layer, is formed over the second layer 220, and over a fourth layer 230, discussed below. A scatterer layer provides a finished mask with a high scattering power due to the scatterer layer composition. The third layer 240 may be a metal nitride, a metal-semiconductor nitride, a noble metal, a metal alloy or a refractory metal. In essence, the third layer 240 is a material that has atoms with an atomic number of at least 72, including gold, tantalum, and tantalum compounds such as tantalum silicide and tantalum silicon nitride, tungsten and compounds of tungsten such as tungsten nitride and tungsten titanium nitride. The third layer 240 typically has a thickness of 250 angstroms, generally no more than about 500 angstroms, and is typically deposited using sputtering techniques.

A fourth layer 230, considered an etch stop layer, is formed in this embodiment of the present invention between the second layer 220 and the third layer 240. It is understood, however, that a fourth layer 230 may not be needed in other embodiments of the present invention. The fourth layer 230 is typically a chromium layer, but may also be materials that are selective to the etch process that are used to pattern the scatterer layer. Such materials may include any conductive material, as for example, titanium. The fourth layer 230 is typically 50 angstroms in thickness and is deposited using sputtering techniques. The fourth layer 230 is used to prevent damage to the second layer 220 when the third layer 240, the scatterer layer, is etched. At step 225, a second substrate resist layer 250, typically with a thickness in the range of 1,500 to 5,000 angstroms, has been spun on the third layer 240 and patterned to form an attenuating pattern 226 corresponding to a semiconductor device feature pattern. The pattern is then developed using conventional patterning techniques. Then, at step 235, the second substrate resist layer pattern 226 is transferred into the scatterer layer 240 and resist layer 250 is removed.

Figure 2:
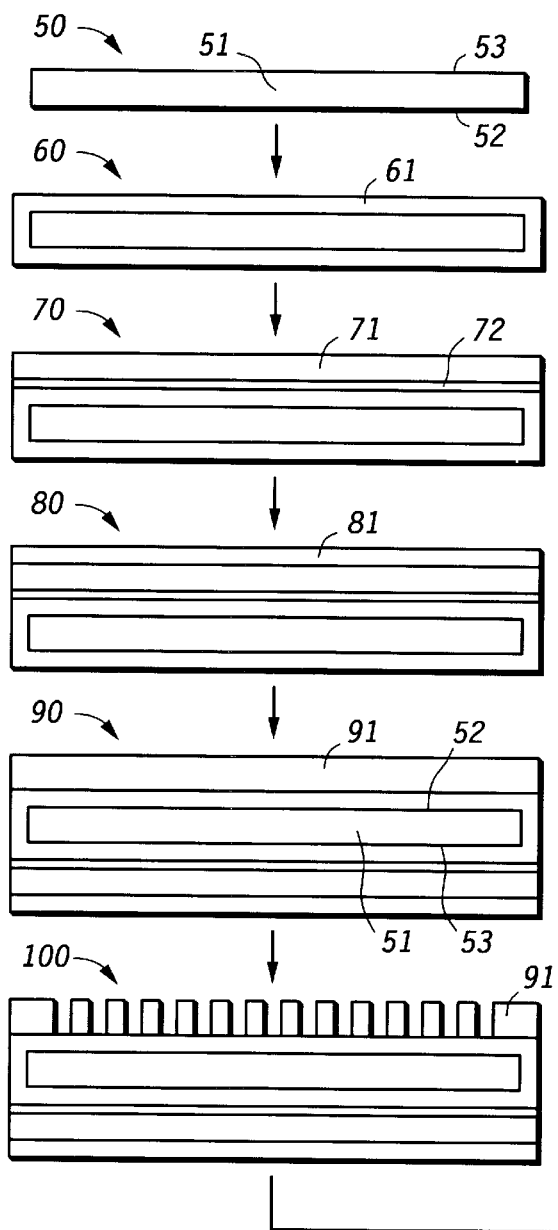
FIG. 2 is a prior art cross-sectional view of certain relevant steps in the fabrication of a mask used in the lithography technique shown in prior art FIG. 1.
Figure 2:
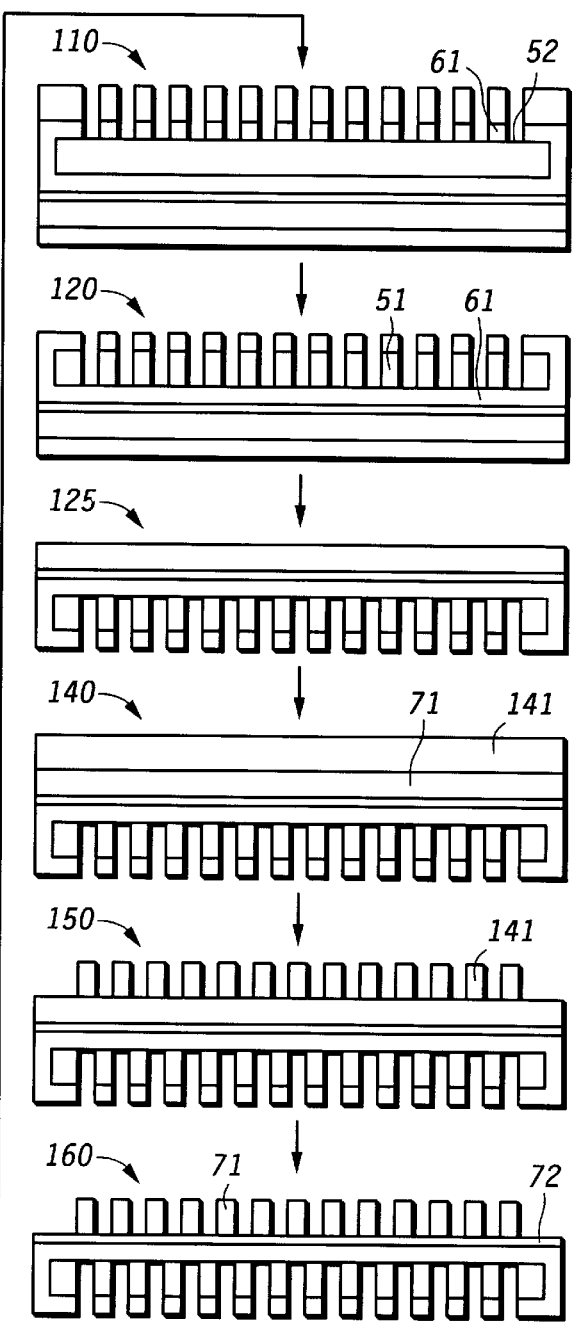
Figure 2A:
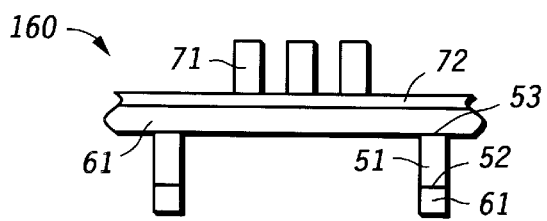
FIG. 2A is an exploded prior art cross-sectional view of the mask at step 160 of FIG. 2.

At this point, the advantages of this method are understandable. First, the first and second substrates have been processed to steps 335 and 235 respectively without the need for any protective layers as needed in the prior art processing steps 80 and 125 of FIG. 2, thereby reducing additional steps of forming and removing the protective layers. Furthermore, the processing of the first and second substrates has been performed on a first 310 and second 210 base, which is much easier than processing on thin membranes as in steps 140, 150 and 160 of prior art FIG. 2. Still further, the processing of these substrates is only on one side of each substrate, the first substrate first side 311 and the second substrate first side 211. As such, two wafers are individually processed, as opposed to the prior art. This individual wafer processing shortens TAT and reduces damage to the substrates.

Figure 3A:
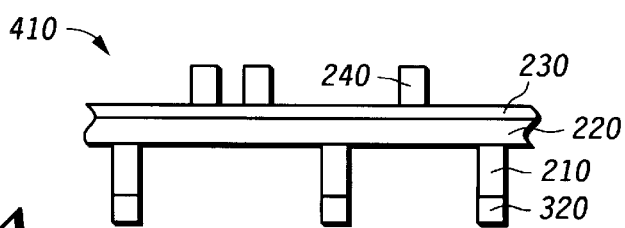
FIG. 3A is an exploded cross-sectional view of the semiconductor device at step 410 of FIG. 3.

At step 400, the first substrate 310, that is at processing step 335, is bonded with the second substrate 210, that is at a process step 235, to form the structure at step 400. The bonding of the first substrate 310 and the second substrate 210 is performed by conventional bonding techniques familiar to those skilled in the art, for example anodic bonding, epoxy bonding, thermal compression bonding or other similar bonding techniques. Specifically, to achieve the structure at step 400, the first layer 320 of the first substrate 301 is bonded to the second base second side 212 of the second substrate 201 at step 235. At step 410, the second base 210 is etched, using for example a wet etchant, to remove the entire thickness of the second base 210 corresponding to the first pattern 351 to form an embodiment of the lithographic mask of the present invention. FIG. 3A is an exploded cross-sectional view of the semiconductor device at step 410 of FIG. 3 depicting the patterned scatterer layer 240 positioned between the "struts" (i.e. the patterned second base 210).

Figure 4:
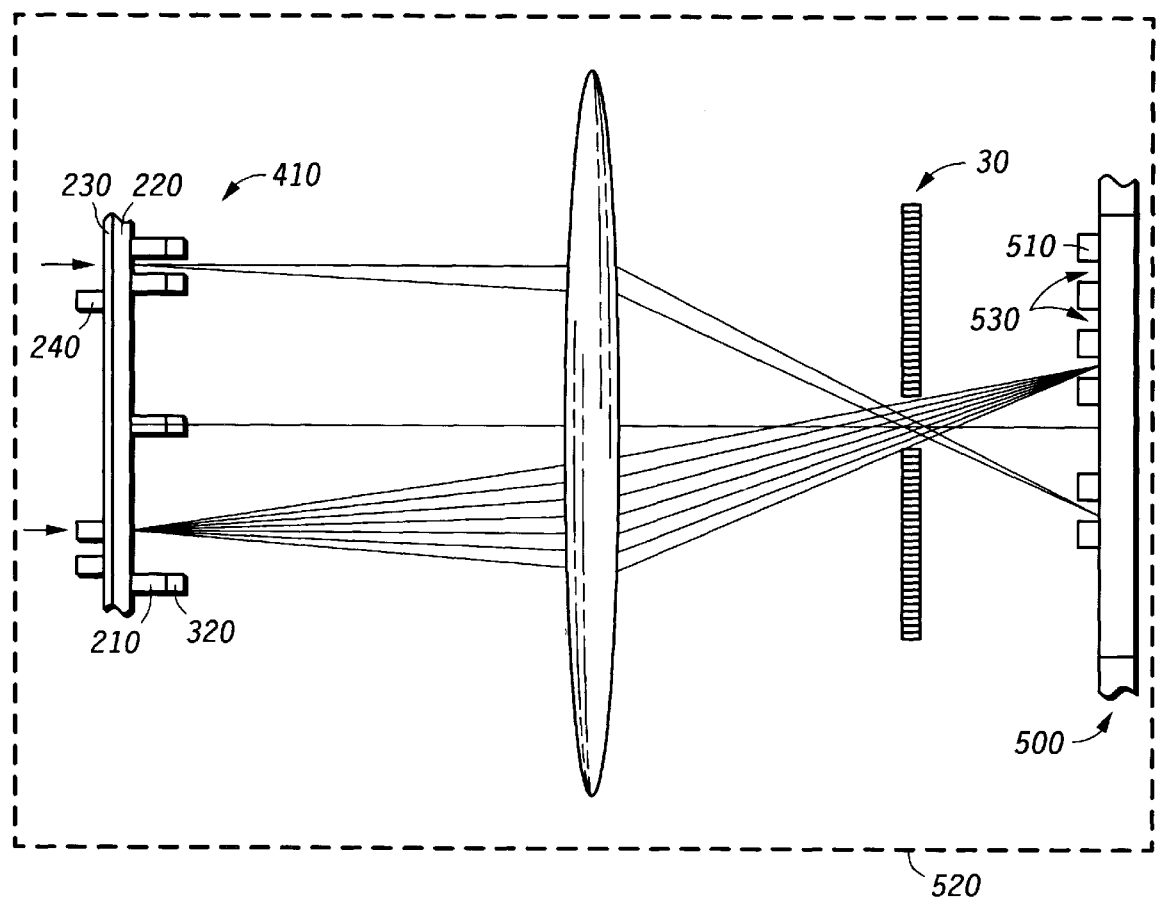
FIG. 4 depicts a schematic view of the forming of a semiconductor device using the method of forming a lithographic mask of the present invention.

In use, this embodiment of the lithographic mask of the present invention would be obtained and used as shown in FIG. 4 to form a semiconductor device using a further method of the present invention. Specifically, the mask 410 of FIGS. 3 and 3A is used in the further method of forming the semiconductor device as depicted in FIG. 4. A first semiconductor device layer (shown as a patterned first semiconductor device layer 510), typically an insulator, is formed over the semiconductor substrate 500. A semiconductor device resist layer (not shown) is formed over the first semiconductor device layer 510 and selectively exposed using a projection electron beam tool shown schematically in FIG. 4. The first semiconductor device layer 510 is then selectively etched after the exposure to form the patterned first semiconductor device layer 510. The selective etching forms openings 530 in the first semiconductor device layer 510 where the openings 530 act as conductive members. The semiconductor device is then formed by removing the semiconductor device resist layer after the etching step. Typically, reduction optics are employed in projection electron beam lithography so that the features on the wafer are a fraction (e.g. one quarter) of the size of the features on the mask. Additional steps not illustrated in FIG. 4 include a step of further etching into the semiconductor device substrate 500 to form a trench within the substrate 500. Once the trench is formed, an insulating layer would be deposited over the semiconductor device substrate 500 and within the trench so that, after a subsequent step of removing the insulating layer laying outside of the trench, a field isolation region is formed within the substrate 500. FIGS. 5–8 provide further embodiments of the method of the present invention where the steps of FIG. 3 have been reordered to form further embodiments of the method of forming a lithographic mask of the present invention. It is understood that the further embodiments illustrated in FIGS. 5–8 may be incorporated in the method of forming a semiconductor device of the present invention, as depicted in FIG. 4, in addition to being further embodiments of the method of forming a lithographic mask of the present invention.

Figure 5:
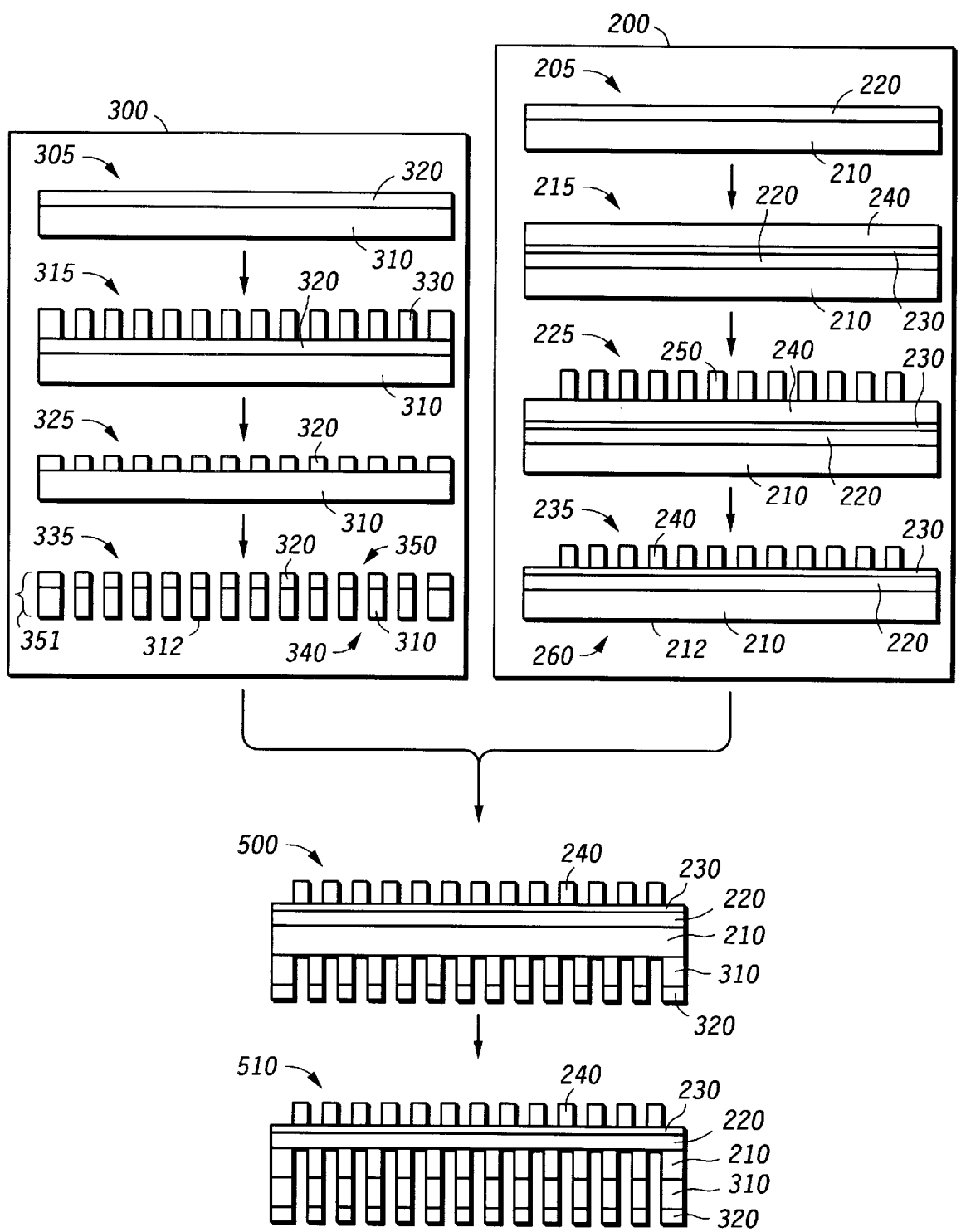
FIG. 5 depicts cross-sectional views of the steps used in a further embodiment of the method of forming a lithographic mask of the present invention.

FIG. 5 depicts cross-sectional views of the steps used in a further embodiment of the method of forming a lithographic mask of the present invention. This embodiment is made by following identical steps to those steps used in FIG. 3 to form identical first and second substrates at steps 335 and 235, but then "flipping" the first substrate 310 at processing step 335 upside down so that the first base second side 312 is bonded to the second base second side 212 to form the device at step 500. Then at step 510, the second base 210 has been etched to remove the entire thickness of the second base 210 corresponding to the first pattern 351. It is noted that while the step 510 depicts the first base 310 and the second base 210 as different layers, both are typically composed of the same material, e.g. silicon. This embodiment of the present invention is used in a similar fashion as the mask of FIG. 3 as shown in FIG. 4.

Figure 6:
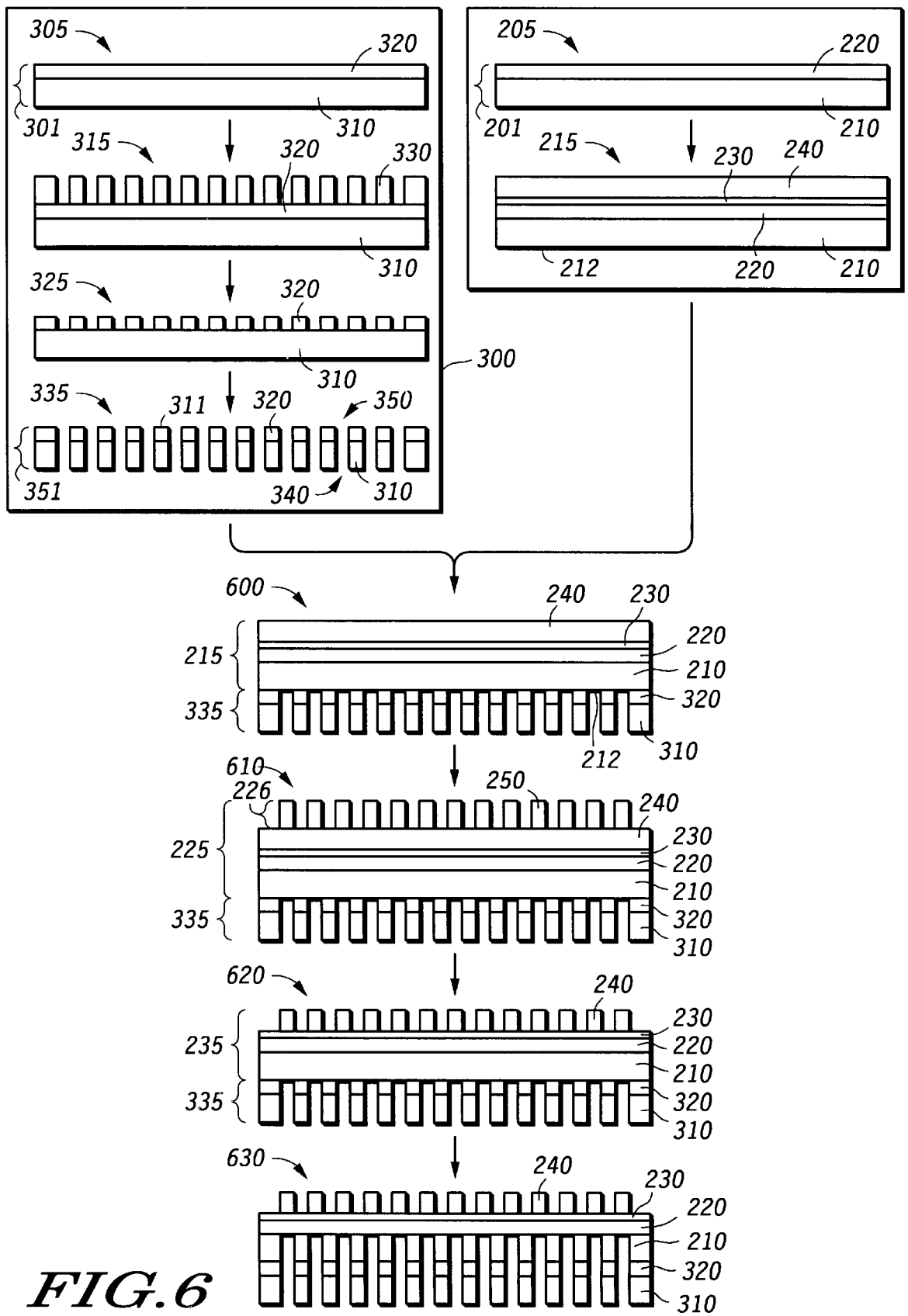
FIG. 6 depicts cross-sectional views of the steps used in a still further embodiment of the method of forming a lithographic mask of the present invention.

FIG. 6 depicts cross-sectional views of the steps used in a further embodiment of the method of forming a lithographic mask of the present invention. In FIG. 6, the processing to the first substrate 301 to step 335 is identical as the processing shown in the other embodiments of FIGS. 3 and 5. However, the processing to the second substrate 201 terminates at step 215, instead of step 235 as in FIGS. 3 and 5. Then at step 600, bonding, e.g. anodic bonding, between the second base second side 212 and the first base first side 311 is performed to form the structure at step 600. From steps 610 through 630, a so-called "wafer flow" occurs which means that all the processing occurs on the second base 210 until step 630 when the entire thickness of the second base 210 is removed. Thus, a second base 210, or wafer, is used throughout the steps until the mask at 630, which corresponds to the mask at step 410 of FIG. 3. At 610, as in step 225 of FIG. 3, the second substrate resist layer 250, typically with a thickness in the range of 1,500 to 5,000 angstroms, has been spun on the third layer 240 and patterned to form an attenuating pattern 226 corresponding to a semiconductor device feature pattern. The pattern is then developed using conventional processing techniques. Then, at step 620, as in step 235 of FIG. 3, the second substrate resist layer 250 is used to define the pattern that is transferred into the scatterer layer 240 and removed. At step 630, as in step 410 of FIG. 3, the second base 210 is etched to remove the entire thickness of the second base 210 corresponding to the first pattern 351 to form an embodiment of the lithographic mask of the present invention. This embodiment of the present invention is used as is the embodiment of FIG. 3 as shown in FIG. 4.

Figure 7:
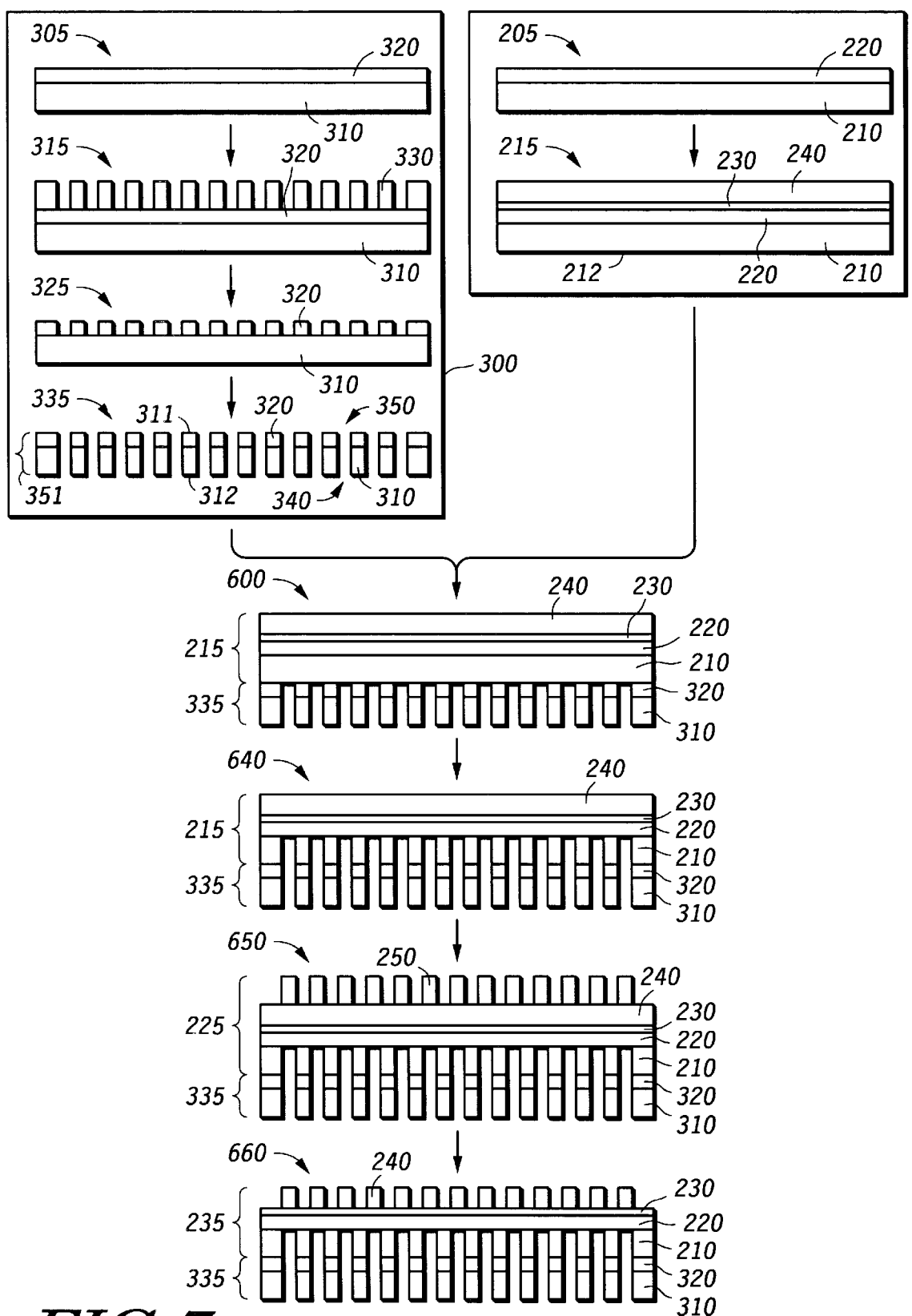
FIG. 7 depicts cross-sectional views of the steps used in still another embodiment of the method of forming a lithographic mask of the present invention.

FIG. 7 depicts cross-sectional views of the steps used in a further embodiment of the method of forming a lithographic mask of the present invention. The difference between the embodiment depicted in FIG. 6 and the embodiment of FIG. 7 is that at step 640, the second base 210 is etched to remove the entire thickness of the second base 210 corresponding to the first pattern 351, before patterning the third layer 240. This order of steps is termed a "membrane flow" since the steps from step 650 to step 660 are performed on a membrane only, since the second base 210 has been etched. This embodiment of the present invention is used as is the embodiment of FIG. 3.

Figure 8:
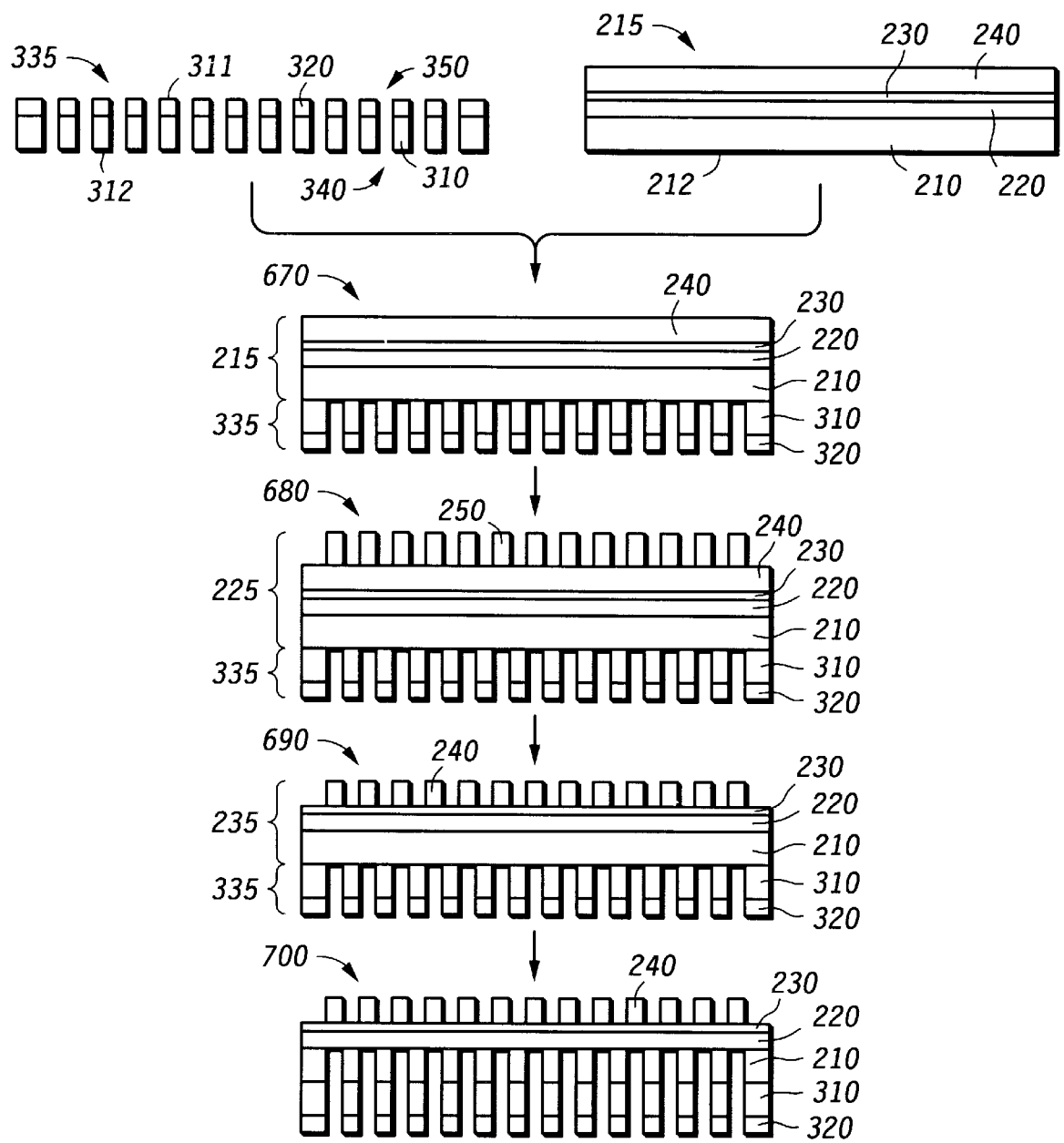
FIG. 8 depicts cross-sectional views of the steps used in still another embodiment of the method of forming a lithographic mask of the present invention.

FIG. 8 depicts cross-sectional views of the steps used in a further embodiment of the method of forming a lithographic mask of the present invention. The difference between the embodiment depicted in FIG. 7 and this embodiment is that the mask at step 335 is "flipped" over so that the first base second side 312 is bonded to the second base second side 212 as shown in step 670. In steps 680 through 700, a "wafer flow" is performed as in steps 610 through 630 of FIG. 6. A still further embodiment would include a "membrane flow", as shown in steps 640 through 660 of FIG. 7, to occur from steps 680 through 700.

These embodiments of the method of forming the lithographic mask of the present invention have numerous advantages. Since two substrates are processed simultaneously, the TAT is improved. Likewise, either the first substrate or the second substrate can be stockpiled for fast TAT when needed. A further advantage is that minimal handling is used. Since only one side of each substrate is processed at a time, there is no backside handling needed with this methodology and, therefore, no special chuck tooling is needed. Further, this methodology is much more flexible than the prior art methodology since, for example, more materials can be used that may not have been available with the prior art and more processing options or techniques can be used that were more limited with the prior art. Substrate thicknesses may be tailored while the prior art would not permit such tolerances or variations. Further, such methodology can be used in a typical fab and is more manufacturable than the prior art.

The method of the present invention has been described in connection with the preferred embodiments as disclosed herein. Although several embodiments of the present invention have been shown and described in detail, along with variances thereof, many other varied embodiments that incorporate the teachings of the invention may be easily constructed by those skilled in the art that may fall within the scope of the present invention as claimed below. For example, a further embodiment would be identical to the steps of FIG. 6, but the bonding of the two substrates would occur between the second base second side 212 at step 205, instead of step 215 as in FIG. 6. Thereafter, the step 215 of FIG. 6 would occur after the bonding step but before step 610 of FIG. 6. A further embodiment would again bond the two substrates of FIG. 7 at step 205 with step 215 occurring after the bonding and before step 640. Two other embodiments would be performed by processing the two substrates in accordance with these two embodiments that bond at step 205, but instead of bonding the second base second side 212 with the first base first side 311, the first substrate is "flipped" so that the bonding occurs between the first base second side 312 and the second base second side 212.

We claim:

1. A method of forming a lithographic mask comprising the steps of:

obtaining a first substrate having a first base and a first layer over said first base;

patterning said first layer and at least a portion of an entire thickness of said first base to form a first pattern;

obtaining a second substrate having a second base;

forming a second layer over said second base;

forming a third layer over said second layer;

patterning said third layer to form an attenuating pattern corresponding to a semiconductor device feature pattern;

bonding said first and second substrates after patterning said first layer; and etching said second base to remove an entire thickness of said second base corresponding to said first pattern.

2. The method of claim 1, wherein said step of patterning said third layer is performed before the step of etching said second base.

3. The method of claim 2, wherein said step of patterning said first layer comprises a step of etching through an entire thickness of said first base.

4. The method of claim 1, wherein said first and second substrates are bonded.

5. The method of claim 1, wherein:

said step of forming said third layer is performed after said bonding step.

6. The method of claim 1, further comprising a step of forming a fourth layer between said steps of forming said second layer and forming said third layer, wherein said fourth layer is conductive.

7. The method of claim 1, wherein said second layer is a membrane for the lithographic mask and includes a material selected from a group consisting of silicon nitride, doped semiconductor, silicon carbide, and diamond.

8. The method of claim 7, wherein said second layer has a thickness no more than approximately 1500 angstroms.

9. The method of claim 1, wherein said third layer includes a material selected from a group consisting of metal nitrides, metal-semiconductor nitrides, noble metals, metal alloys and refractory metals.

10. The method of claim 1, wherein said third layer has a thickness no more than approximately 500 angstroms.

11. The method of claim 1, wherein said third layer includes a material having at least one constituent with an atomic number of at least approximately 72.

12. The method of claim 1, wherein:

said step of obtaining said first substrate includes a step of providing said first base that includes a first base semiconductor material, a first base first side and a first base second side, wherein each of said first base first and second sides lie substantially along a first crystal plane selected from a group consisting of a (100) crystal plane and a (110) crystal plane; said step of obtaining said second substrate includes a step of providing said second base that includes a second base semiconductor material, a second base first side and a second base second side, wherein each of said second base first and second sides lie substantially along a second crystal plane selected from a group consisting of the (100) crystal plane and the (110) crystal plane; and said step of etching is performed using a wet etchant.

13. The method of claim 12, wherein:

said step of obtaining said first substrate includes a step of depositing said first layer on said first base first side and not on said first base second side;

said step of forming said second layer includes a step of depositing the second layer on said second base first side and not on said second base second side; and said step of bonding is performed such that said first layer is bonded to said second base second side.

14. The method of claim 12, wherein:

said step of obtaining said first substrate includes a step of depositing said first layer on said first base first side and not on said first base second side;

said step of forming said second layer includes a step of depositing the second layer on said second base first side and not on said second base second side; and said step of bonding is performed such that said first base second side is bonded to said second base second side.

15. The method of claim 1, wherein said step of etching said second base is performed before said step of patterning said third layer.

16. The method of claim 15, wherein said step of patterning said first layer comprises a step of etching through an entire thickness of said first base before said step of bonding.

17. A method of forming a semiconductor device comprising the steps of:

forming a first semiconductor device layer over a semiconductor device substrate;

coating a semiconductor device resist layer over said first semiconductor device layer;

obtaining a mask formed by steps of:

obtaining a first substrate having a first base and a first layer over said first base;

patterning said first layer and at least a portion of an entire thickness of said first base to form a first pattern;

obtaining a second substrate having a second base;

forming a second layer over said second base;

forming a third layer over said second layer;

patterning said third layer to form an attenuating pattern corresponding to a semiconductor device feature pattern;

bonding said first and second substrates after patterning said first layer; and etching said second base to remove an entire thickness of said second base corresponding to said first pattern;

selectively exposing said semiconductor device resist layer using a projection electron beam tool and the mask;

selectively etching said semiconductor device first layer after said step of selectively exposing; and removing said semiconductor device resist layer after said step of selectively etching.

18. The method of claim 17, wherein said step of selectively etching forms a conductive member over said semiconductor device substrate.

19. The method of claim 17, wherein the step of selectively etching forms openings through said first semiconductor device layer that is an insulator.

20. The method of claim 17, wherein:

said step of selectively etching further forms a trench within said semiconductor device substrate; and said method further includes steps of:

depositing an insulating layer over said semiconductor device substrate and within said trench; and removing said insulating layer lying outside said trench to form a field isolation region.

21. The method of claim 17, wherein said step of patterning said third layer is performed before said step of etching said second base.

22. The method of claim 21, wherein said step of patterning said first layer comprises a step of etching through an entire thickness of said first base.

23. The method of claim 17, wherein said first and second substrates are bonded.

24. The method of claim 17, wherein:

said step of forming the third layer is performed after said bonding step.

25. The method of claim 17, further comprising a step of forming a fourth layer between said steps of forming said second layer and forming said third layer, wherein said fourth layer is conductive.

26. The method of claim 17, wherein said second layer is a membrane for the mask and includes a material selected from a group consisting of silicon nitride, doped semiconductor, silicon carbide, and diamond.

27. The method of claim 26, wherein said second layer has a thickness no more than approximately 1,500 angstroms.

28. The method of claim 17, wherein said third layer includes a material selected from a group consisting of metal nitrides, metal-semiconductor nitrides, noble metals, metal alloys and refractory metals.

29. The method of claim 17, wherein said third layer has a thickness no more than approximately 500 angstroms.

30. The method of claim 17, wherein said third layer includes a material having at least one constituent with an atomic number of at least approximately 72.

31. The method of claim 17, wherein:

said step of obtaining said first substrate includes a step of providing said first base that includes a first base semiconductor material, a first base first side and a first base second side, wherein each of said first base first and second sides lie substantially along a first crystal plane selected from a group consisting of a (100) crystal plane and a (110) crystal plane;

said step of obtaining said second substrate includes a step of providing said second base that includes a second base semiconductor material, a second base first side and a second base second side, wherein each of said second base first and second sides lie substantially along a second crystal plane selected from a group consisting of the (100) crystal plane and the (110) crystal plane; and said step of etching is performed using a wet etchant.

32. The method of claim 31, wherein:

said step of obtaining said first substrate includes a step of depositing said first layer on said first base first side and not on said first base second side;

said step of forming said second layer includes a step of depositing the second layer on said second base first side and not on said second base second side; and said step of bonding is performed such that said first layer is bonded to said second base second side.

33. The method of claim 31, wherein:

said step of obtaining said first substrate includes a step of depositing said first layer on said first base first side and not on said first base second side;

said step of forming said second layer includes a step of depositing the second layer on said second base first side and not on said second base second side; and said step of bonding is performed such that said first base second side is bonded to said second base second side.

34. The method of claim 17, wherein said step of etching said second base is performed before said step of patterning said third layer.

35. The method of claim 34, wherein said step of patterning said first layer comprises a step of etching through an entire thickness of said first base before said bonding step.

* * * * *